US012611726B2

(12) United States Patent
Kim et al.

(10) Patent No.: US 12,611,726 B2
(45) Date of Patent: *Apr. 28, 2026

(54) MASK AND METHOD FOR MANUFACTURING THE SAME

(71) Applicant: Samsung Display Co., Ltd., Yongin-si (KR)

(72) Inventors: Jeongkuk Kim, Suwon-si (KR); Hwi Kim, Suwon-si (KR); Areum Lee, Suwon-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1059 days.

This patent is subject to a terminal disclaimer.

(21) Appl. No.: 17/713,729

(22) Filed: Apr. 5, 2022

(65) Prior Publication Data

US 2022/0399531 A1     Dec. 15, 2022

(30) Foreign Application Priority Data

Jun. 14, 2021     (KR) ........................ 10-2021-0077023

(51) Int. Cl.
| | |
|---|---|
| *B23K 26/00* | (2014.01) |
| *B23K 26/06* | (2014.01) |
| *B23K 26/0622* | (2014.01) |
| *B23K 26/38* | (2014.01) |
| *C23C 14/04* | (2006.01) |
| *B23K 103/02* | (2006.01) |

(52) U.S. Cl.
CPC ...... *B23K 26/0006* (2013.01); *B23K 26/0619* (2015.10); *B23K 26/0624* (2015.10); *B23K 26/38* (2013.01); *C23C 14/042* (2013.01); *B23K 2103/02* (2018.08)

(58) Field of Classification Search
CPC ............................ C23C 14/042; C23C 16/042
See application file for complete search history.

(56) References Cited

U.S. PATENT DOCUMENTS

| | | | | |
|---|---|---|---|---|
| 8,846,551 | B2 * | 9/2014 | Gupta | ................. B23K 26/355 977/901 |
| 9,656,291 | B2 * | 5/2017 | Lee | ..................... B23K 26/382 |
| 10,428,415 | B2 | 10/2019 | Park et al. | |
| 10,680,177 | B2 | 6/2020 | Park et al. | |
| 10,883,165 | B2 | 1/2021 | Kim et al. | |
| 11,345,988 | B2 | 5/2022 | Kim et al. | |

(Continued)

FOREIGN PATENT DOCUMENTS

| | | | |
|---|---|---|---|
| JP | 2008-41327 | | 2/2008 |
| JP | 2008041327 A | * | 2/2008 |

(Continued)

*Primary Examiner* — Binh X Tran

(74) *Attorney, Agent, or Firm* — CANTOR COLBURN LLP

(57) ABSTRACT

A mask includes a mask sheet including an upper surface and a lower surface facing the upper surface, the mask sheet including an opening passing through the upper surface and the lower surface; and a mask frame that supports the mask sheet, the mask sheet includes a protrusion adjacent to the opening and protruding from the lower surface, and a recess adjacent to the protrusion and recessed from the lower surface toward the upper surface of the mask sheet.

7 Claims, 12 Drawing Sheets

(56)        References Cited

U.S. PATENT DOCUMENTS

| 2014/0238963 | A1  | 8/2014  | Jo et al. |
|---|---|---|---|
| 2018/0202035 | A1* | 7/2018  | Park ..................... H01L 21/027 |
| 2021/0355572 | A1  | 11/2021 | Li et al. |
| 2023/0116956 | A1* | 4/2023  | Kim ...................... B23K 26/38 |
|  |  |  | 219/121.73 |

FOREIGN PATENT DOCUMENTS

| KR | 10-1075689      | 10/2011 |
|---|---|---|
| KR | 10-2011-0133075 | 12/2011 |
| KR | 10-1362165      | 2/2014  |
| KR | 10-2014-0105239 | 9/2014  |
| KR | 10-1674506      | 11/2016 |
| KR | 10-1900281      | 9/2018  |
| KR | 10-1955454      | 3/2019  |
| KR | 10-2019-0068675 | 6/2019  |
| KR | 10-2000548      | 7/2019  |
| KR | 10-2020-0013782 | 2/2020  |
| KR | 10-2020-0081609 | 7/2020  |

* cited by examiner

MASK AND METHOD FOR MANUFACTURING THE SAME

CROSS-REFERENCE TO RELATED APPLICATION(S)

This application claims priority to and benefits of Korean Patent Application No. 10-2021-0077023 under 35 U.S.C. § 119, filed on Jun. 14, 2021 in the Korean Intellectual Property Office, the entire contents of which are incorporated herein by reference.

BACKGROUND

1. Technical Field

The disclosure herein relates to a mask and a method for manufacturing the same, and, to a mask manufactured through laser processing, and a method for manufacturing the same.

2. Description of the Related Art

A display panel may include pixels. Each pixel may include a driving element such as a transistor, and a display element such as an organic light-emitting element. A display element may be formed by stacking an electrode and various functional layers on a substrate.

Functional layers constituting a display element may be provided by being patterned using a mask having an opening region defined therethrough. Here, the shapes of the patterned functional layers may be controlled according to the shape of the opening region of the mask, for example. Accordingly, technical development is required for a mask in which an opening region is machined with high precision to improve the deposition quality of the patterned functional layers, and for a method for manufacturing such a mask.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a mask for improving the deposition quality of functional layers formed on a target substrate and a method for manufacturing the mask.

An embodiment provides a mask including a mask sheet which may include an upper surface and a lower surface facing the upper surface, the mask sheet including an opening passing through the upper surface and the lower surface; and a mask frame that supports the mask sheet, wherein the mask sheet may include a protrusion adjacent to the opening and protruding from the lower surface; and a recess adjacent to the protrusion and recessed from the lower surface toward the upper surface of the mask sheet.

In an embodiment, a thickness of the protrusion may be in a range of about 1 μm to about 10 μm.

In an embodiment, a thickness of the recess may be in a range of about 1 μm to about 10 μm, In an embodiment, a distance between the lower surface and the upper surface of the mask sheet may be in a range of about 20 μm to about 200 μm.

In an embodiment, the opening may have a substantially trapezoidal shape on a cross-section, and a width of the opening may increase from the lower surface toward the upper surface of the mask sheet.

In an embodiment, an opening side surface of the mask sheet forming the opening may have an inclination angle in a range of about 30° to about 70° with respect to the lower surface of the mask sheet.

In an embodiment, a side of the recess may be extended to a side of the protrusion.

In an embodiment, the protrusion may be disposed between the opening and the recess of the mask sheet.

In an embodiment, the protrusion may have a substantially curved protrusive bottom surface protruding away from the lower surface of the mask sheet.

In an embodiment, the protrusion may be disposed in a form of a stripe parallel to a side of the opening in a plan view.

In an embodiment, the mask sheet may include an alloy of iron (Fe) and nickel (Ni).

In an embodiment, the thermal expansion coefficient of the mask sheet may be about 5 ppm/° C. or less.

In an embodiment, the mask sheet may deposit at least one functional layer or a second electrode of a light-emitting element including a first electrode and a second electrode facing each other, and at least one functional layer disposed between the first electrode and the second electrode.

In an embodiment, a mask may include a mask sheet including opening regions in a plan view, and a mask frame that supports the mask sheet, wherein the mask sheet may include a base portion in which the opening regions are formed, protrusions disposed on a lower surface of the base portion, and protruding away from the lower surface, and recesses recessed in the lower surface of the base portion of the mask sheet.

In an embodiment, the opening regions may be formed to provide functional layers spaced apart from each other and including a same material on a target substrate.

In an embodiment, the protrusions may be adjacent to the target substrate, and the base portion may be spaced apart from the target substrate.

In an embodiment, the protrusions may be adjacent to the opening regions, sides of the recesses may be respectively connected to sides of the protrusions, and the recesses may be respectively spaced apart from the opening regions with the adjacent protrusions disposed between the opening regions.

In an embodiment, each of the opening regions may have a substantially rectangular shape in a plan view, and the protrusions and the recesses adjacent to the opening regions may have a substantially stripe shape parallel to a side of the opening regions in a plan view.

In an embodiment, a method for manufacturing a mask may include preparing a preliminary mask sheet including an upper surface and a lower surface facing each other; forming an opening by irradiating the upper surface of the preliminary mask sheet with first laser light such that the opening penetrates from the upper surface to the lower surface of the preliminary mask sheet; irradiating repeatedly, with second laser light, the lower surface of the preliminary mask sheet adjacent to the opening; and forming a mask sheet including a protrusion adjacent to the opening and protruding from the lower surface, and a recess adjacent to the protrusion and recessed from the lower surface, by repeating irradiation with the second laser light.

In an embodiment, the first laser light and the second laser light may each have a pulse width in a range of about $10^{-15}$ sec to about $10^{-12}$ sec.

In an embodiment, in the forming of the opening, a width of the opening may decrease from the upper surface toward the lower surface of the preliminary mask sheet.

In an embodiment, an opening side surface of the mask sheet exposed in the opening may have an inclination angle in a range of about 30° to about 70° with respect to the lower surface of the preliminary mask sheet.

In an embodiment, the irradiating repeatedly with the second laser light of lower surface of the preliminary mask sheet may include repeatedly irradiating a same point in the lower surface adjacent to the opening with the second laser light of a same power.

In an embodiment, the protrusion may have a height in a range of about 1 μm to about 10 μm.

In an embodiment, the forming of the mask sheet may include forming the protrusion adjacent to the opening according to an incident angle of the second laser light, and forming the recess adjacent to the protrusion.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings:

FIG. 1 is a schematic plan view of a display device according to an embodiment;

FIG. 2 is a schematic cross-sectional view of a part of a display device according to an embodiment;

FIG. 5A is a schematic cross-sectional view of a part of a mask according to an embodiment;

FIG. 5B is a schematic cross-sectional view of a part of a mask according to an embodiment;

DETAILED DESCRIPTION OF THE EMBODIMENTS

Figure 3:
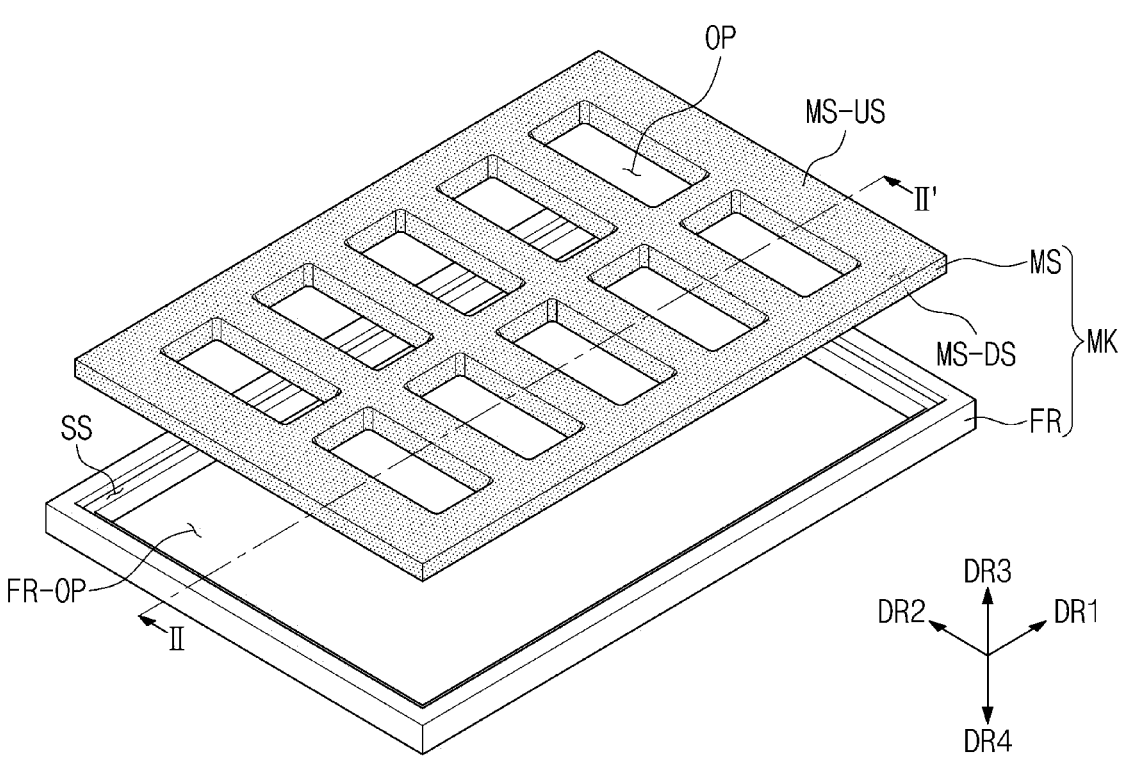
FIG. 3 is an exploded perspective view of a mask according to an embodiment.

In the disclosure, various modifications may be made and various forms may be applied, and embodiments will be illustrated in the drawings and described in detail in the text. However, this is not intended to limit the disclosure to a disclosure form, it should be understood to include all changes, equivalents, and substitutes included in the spirit and scope of the disclosure.

In this specification, when a component (or region, layer, portion, for example) is referred to as "on", "connected", or "coupled" to another component, it means that it is placed/connected/coupled directly on the other component or a third component can be disposed between them.

In the application, "directly in contact" may mean that there is no layer, film, region, plate, for example added between a portion such as a layer, film, region, or plate and another portion. For example, "direct contact" may mean placing two layers or two members without using an additional member such as an adhesive member therebetween.

The same reference numerals or symbols refer to the same elements. In addition, in the drawings, thicknesses, ratios, and dimensions of components may be exaggerated for effective description of technical content.

"And/or" includes all combinations of one or more that the associated elements may define.

Terms such as first and second may be used to describe various components, but the components should not be limited by the terms. These terms are only used for the purpose of distinguishing one component from other components. For example, without departing from the scope of the disclosure, a first component may be referred to as a second component, and similarly, a second component may be referred to as a first component.

Singular expressions include plural expressions unless the context clearly indicates otherwise. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In addition, terms such as "below", "lower", "above", and "upper" are used to describe the relationship between components shown in the drawings. The terms are relative concepts and are described based on the directions indicated in the drawings but are not necessarily limited thereto. In the specification, "disposed on" may refer to a case of being disposed not only on the upper part of any one member but also on the lower part.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used in this specification have the same meaning as commonly understood by one of ordinary skill in the art to which this disclosure belongs. In addition, terms such as terms defined in commonly used dictionaries should be interpreted as having a meaning consistent with the meaning in the context of the related technology, and should not be interpreted as too ideal or too formal unless explicitly defined here.

Terms such as "comprises," "comprising," "includes," and/or "including,", "has," "have," and/or "having," and variations thereof when used in this specification, are intended to designate the presence of a feature, number, step, action, component, part, or combination thereof described in the specification, and it should be understood that it does not preclude the possibility of presence or addition of one or more other features, numbers, steps, operations, components, parts, or combinations thereof.

The phrase "in a plan view" means viewing the object from the top, and the phrase "in a schematic cross-sectional view" means viewing a cross-section of which the object is vertically cut from the side.

Hereinafter, a mask according to an embodiment and a method for manufacturing a mask according to an embodiment will be described with reference to the accompanying drawings.

Figure 1:
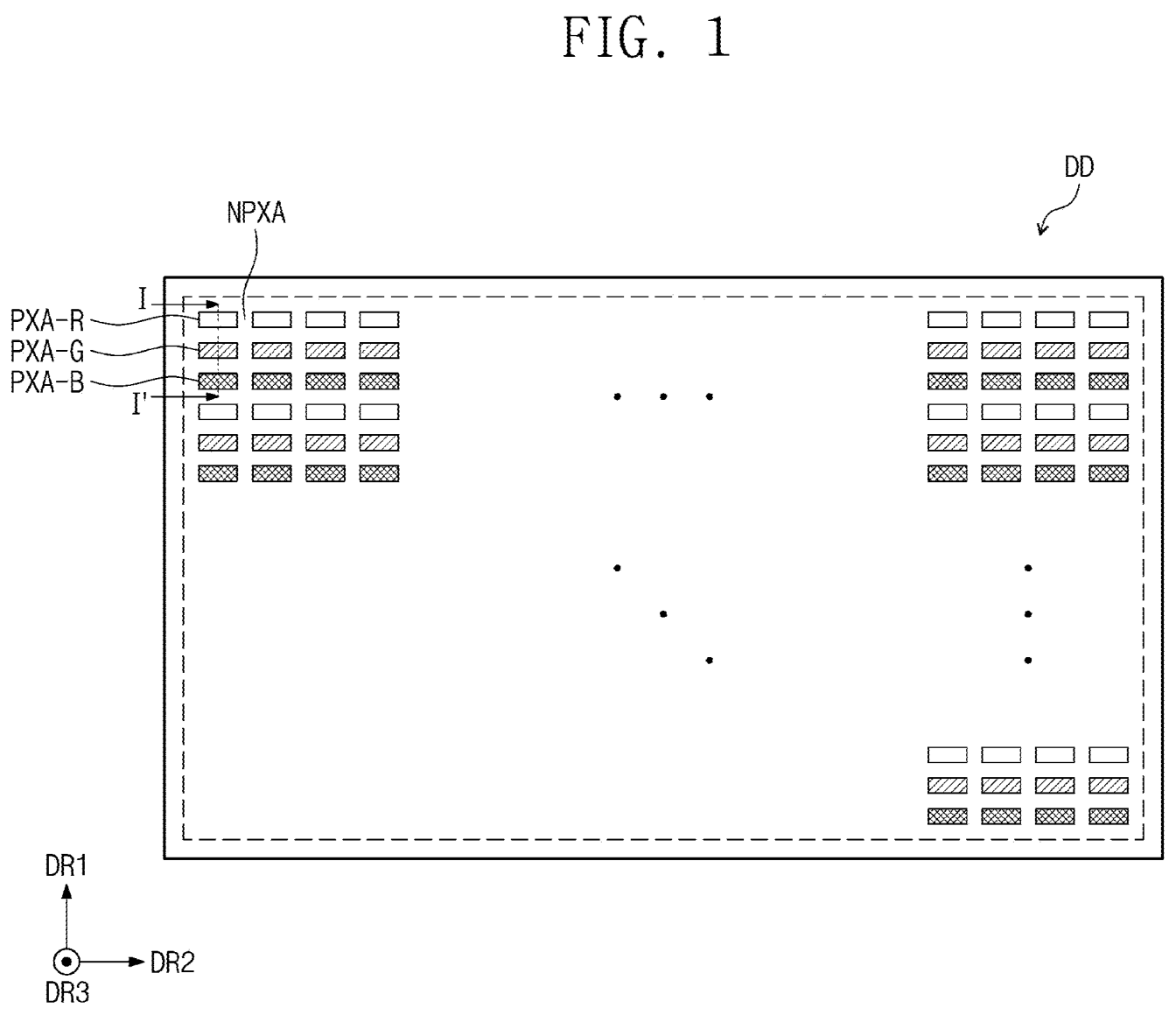
Figure 2:
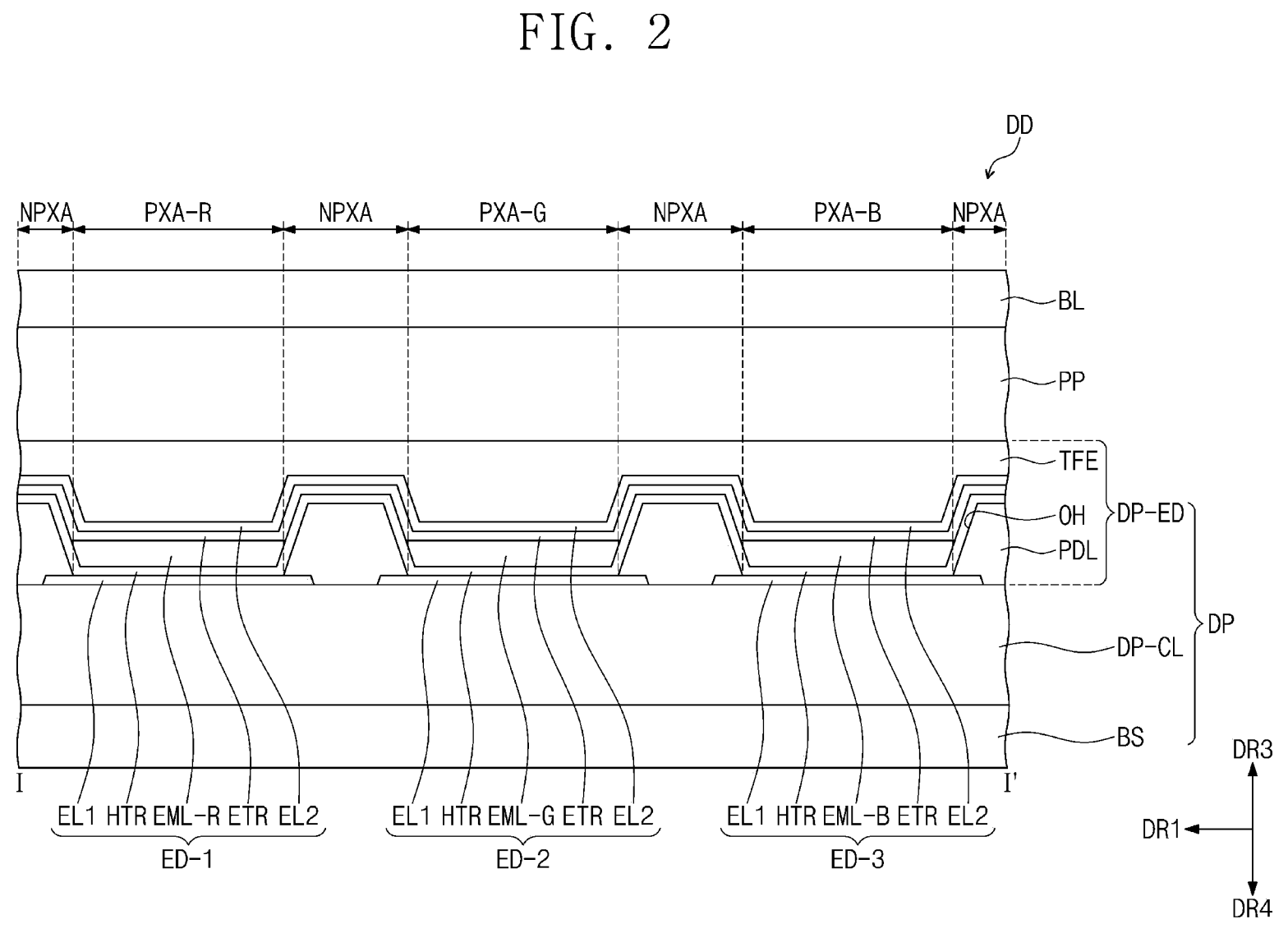

FIG. 1 is a schematic plan view illustrating an embodiment of a display device. FIG. 2 is a schematic cross-sectional view of a display device of an embodiment. FIG. 2 may be a schematic cross-sectional view taken along line I-I' of FIG. 1.

A display device DD illustrated in FIGS. 1 and 2 may include light-emitting regions PXA-R, PXA-G, and PXA-B. The display device DD may include a first light-emitting region PXA-R, a second light-emitting region PXA-G, and a third light-emitting region PXA-B which are separated from each other. For example, the first light-emitting region PXA-R may be a red light-emitting region that emits red light, the second light-emitting region PXA-G may be a green light-emitting region that emits green light, and the third light-emitting region PXA-B may be a blue light-emitting region that emits blue light. The first to third light-emitting regions PXA-R, PXA-G, and PXA-B may be separated without overlapping each other when viewed in a plan view defined by a first direction DR1 and a second direction DR2, and a non-light-emitting region NPXA may be disposed between adjacent light-emitting regions PXA-R, PXA-G, and PXA-B.

An embodiment of a display device illustrated in FIGS. 1 and 2 may include at least one functional layer manufactured using a mask according to an embodiment to be described later. For example, among functional layers included in the display device illustrated in FIGS. 1 and 2, a functional layer in the form of a common layer provided to overlap the entirety of the light-emitting regions PXA-R, PXA-G, and PXA-B may be provided using a mask according to an embodiment to be described later.

A first directional axis DR1 to a fourth directional axis DR4 are illustrated in FIG. 1 and the consecutive drawings, and directions indicated by the first to fourth directional axes DR1, DR2, DR3, and DR4 are relative concepts, and may thus be changed into other directions. The directions indicated by the first to fourth directional axes DR1, DR2, DR3, and DR4 may be referred to as the first to fourth directions, and the same reference symbols may be used. In the preset disclosure, the first directional axis DR1 and the second directional axis DR2 may be orthogonal to each other, and the third directional axis DR3 and the fourth directional axis DR4 may be each normal to a plane defined by the first directional axis DR1 and the second directional axis DR2. The fourth directional axis DR4 and the third directional axis DR3 may be defined as directions opposing each other.

The light-emitting regions PXA-R, PXA-G, and PXA-B are arranged (or disposed) in the form of a stripe in the display device DD illustrated in FIG. 1. For example, in the display device DD illustrated in FIG. 1, first light-emitting regions PXA-R, second light-emitting regions PXA-G, and third light-emitting regions PXA-B may be arranged along the second direction DR2. The first light-emitting region PXA-R, the second light-emitting region PXA-G, and the third light-emitting region PXA-B may be alternately arranged in order along the first direction DR1.

An arrangement form of the light-emitting regions PXA-R, PXA-G, and PXA-B is not limited to FIG. 1 and an order in which the first light-emitting region PXA-R, the second light-emitting region PXA-G, and the third light-emitting region PXA-B are arranged may be provided in various combinations according to the display quality characteristics required for the display device DD. For example, the arrangement form of the light-emitting regions PXA-R, PXA-G, and PXA-B may be a PENTILE™ arrangement form (PENTILE™), or a diamond arrangement form. Areas or planar shapes of the light-emitting regions PXA-R, PXA-G, and PXA-B may be provided being variously adjusted or modified according to the display quality characteristics required for the display device DD.

A functional layer provided as a common layer to entirely overlap the light-emitting regions PXA-R, PXA-G, and PXA-B having such various arrangement forms, and the non-light-emitting region NPXA disposed between the light-emitting regions PXA-R, PXA-G, and PXA-B may be manufactured using a mask according to an embodiment to be described later.

Referring to FIG. 2, the display device DD may include a display panel DP and an optical layer PP disposed on the display panel DP. The display panel DP may include light-emitting elements ED-1, ED-2, and ED-3. The optical layer PP may be disposed on the display panel DP, thereby controlling reflection of light in the display panel DP by external light. For example, the optical layer PP may include a polarization layer or a color filter layer. The optical layer PP in the display device DD according to an embodiment may be omitted unlike what is illustrated in the drawing.

A base substrate BL may be disposed on the optical layer PP. The base substrate BL may be a member that provides a base surface on which the optical layer PP is disposed. The base substrate BL may be an inorganic layer, an organic layer, or a composite material layer. The base substrate BL may be omitted in an embodiment unlike what is illustrated.

In an embodiment, the display panel DP may include a base layer BS, and a circuit layer DP-CL and a display element layer DP-ED provided on the base layer BS, and the display element layer DP-ED may include the light-emitting elements ED-1, ED-2, and ED-3. The display panel DP may include an encapsulation layer TFE disposed on the display element layer DP-ED.

In the display device DD according to an embodiment, the display panel DP may be an organic electroluminescence display panel including an organic electroluminescence element in the display element layer DP-ED. For example, a mask according to an embodiment to be described later may be used, in case that a part of a functional layer of the display element layer DP-ED in an organic electroluminescence display panel is formed.

In an embodiment, the circuit layer DP-CL may be disposed on the base layer BS, and the circuit layer DP-CL may include transistors (not shown). The transistors (not shown) may each include a control electrode, an input electrode, and an output electrode. The circuit layer DP-CL may include insulating layers.

The encapsulation layer TFE may cover or overlap the light-emitting elements ED-1, ED-2, and ED-3. The encapsulation layer TFE may seal the display element layer DP-ED. The encapsulation layer TFE may be a thin film-encapsulation layer.

The light-emitting elements ED-1, ED-2, and ED-3 may respectively include first electrodes ELL hole transfer regions HTR, light-emitting layers EML-R, EML-G, and EML-B, electron transfer regions ETR, and second electrodes EL2. In FIG. 2, the light-emitting layers EML-R, EML-G, and EML-B of the light-emitting elements ED-1, ED-2, and ED-3 may be disposed in opening parts OH defined in pixel-defining films PDL, and the hole transfer region HTR, the electron transfer region ETR, and the second electrode EL2 may be provided as common layers in the entirety of the light-emitting elements ED-1, ED-2, and ED-3. At least one of the hole transfer region HTR, the electron transfer region ETR, or the second electrode EL2 provided as common layers in the light-emitting elements ED-1, ED-2, and ED-3 of the display device DD may be provided using a mask according to an embodiment to be described later.

A part of insulating layers included in the circuit layer DP-CL, or the encapsulation layer TFE disposed on the light-emitting elements ED-1, ED-2, and ED-3 may also be provided using a mask, according to an embodiment to be described later, which may be referred to as an open mask.

Figure 4:
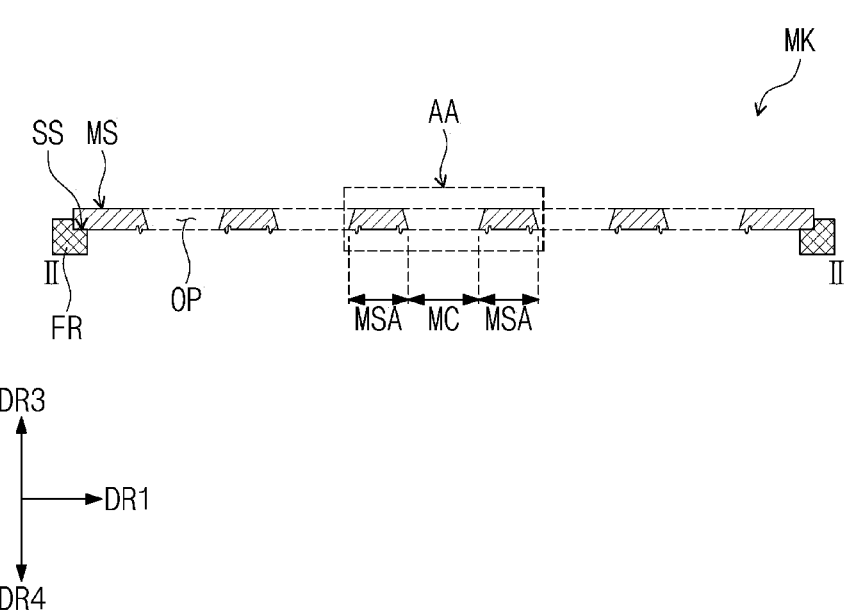
FIG. 4 is a schematic cross-sectional view of a mask according to an embodiment.
Figure 5A:
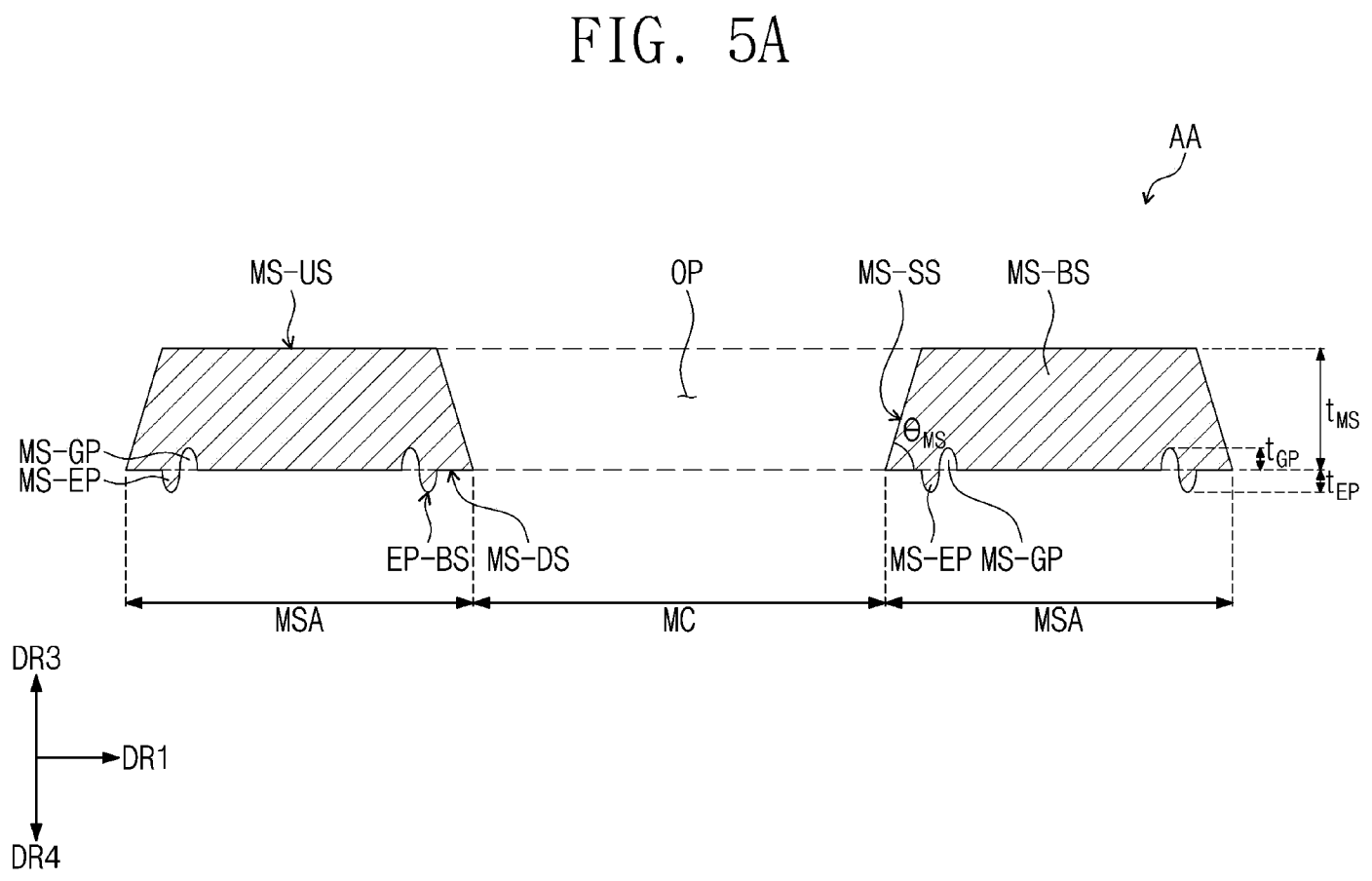

FIG. 3 is an exploded perspective view illustrating a mask according to an embodiment. FIG. 4 is a schematic cross-sectional view of a mask according to an embodiment. FIG. 5A is a schematic cross-sectional view illustrating a part of a mask according to an embodiment. FIG. 4 is a schematic cross-sectional view taken along line II-II' in FIG. 3, and FIG. 5A is a schematic cross-sectional view illustrating region AA in FIG. 4.

Referring to FIGS. 3 to 5A, a mask MK according to an embodiment may include a mask sheet MS and a mask frame FR. The mask MK according to an embodiment may be used for forming a common layer including a same material or a similar material on a target substrate which may be a deposition target surface. The mask MK according to an embodiment may be an open mask for thin film processing used for forming a functional layer provided as a thin film. The open mask for thin film processing may be a mask used to stack a thin film layer of a same material or a similar material on the entirety of the display device on the target substrate.

The mask frame FR may support the mask sheet MS. For example, a frame opening FR-OP may be defined in the mask frame FR, and the mask sheet MS may be disposed in the frame opening FR-OP.

The mask frame FR may support the edge portion of the mask sheet MS. In an embodiment, the mask frame FR may be disposed under or below the mask sheet MS. The mask sheet MS may be seated on the mask frame FR. For example, the mask frame FR may include a supporting surface SS that supports the mask sheet MS on an inner side in which the frame opening FR-OP is defined, and the mask sheet MS may be disposed on the supporting surface SS. However, an embodiment is not limited thereto, and the mask frame FR may be disposed on and under or below the edge of the mask sheet MS to support the mask sheet MS.

The mask frame FR may be formed of a metal material including at least one of iron (Fe) or nickel (Ni). For example, the mask frame FR may include an alloy of iron and nickel. The mask frame FR may be manufactured including stainless steel (SUS), invar, or the like within the spirit and the scope of the disclosure.

The mask sheet MS may include at least one opening region MC. In an embodiment, when viewed in a plan view, the mask sheet MS may include opening regions MC spaced apart from each other. The opening regions MC may be defined being arranged in a plan view in which the first directional axis DR1 and the second directional axis DR2 are defined. FIG. 3 illustrates an embodiment of the mask sheet MS in which five opening regions MC are defined spaced apart from each other along the first directional axis DR1, and two opening regions MC are defined spaced apart from each other along the second directional axis DR2. However, this is an example, and the number of the opening regions MC is not limited to that illustrated in the drawings. The opening regions MC may be arranged to have a spacing along any one direction or a direction of the first directional axis DR1 or the second directional axis DR2. A material forming a functional layer in the form of a common layer may be deposited on a target substrate through the opening regions MC.

The mask sheet MS may be formed of a metal material including at least one of iron (Fe) or nickel (Ni). For example, the mask sheet MS may include an alloy of iron and nickel. The mask sheet MS may be manufactured including stainless steel (SUS), invar, or the like within the spirit and the scope of the disclosure. The mask sheet MS may be formed of a same material or a similar material as the mask frame FR, but an embodiment is not limited thereto.

The mask sheet MS may have a thermal expansion coefficient of about 5 ppm/° C. or less. The mask frame FR may also have a thermal expansion coefficient similar to that of the mask sheet MS. Accordingly, deposition quality on a target substrate may be improved by minimizing thermal deformation of the mask sheet MS in a deposition process.

The mask sheet MS according to an embodiment may have a plate shape extending along the first directional axis DR1 and the second directional axis DR2. In an embodiment, when viewed in a plan view defined by the first directional axis DR1 and the second directional axis DR2, the mask sheet MS may have a rectangular shape, but an embodiment is not limited thereto. The mask sheet MS may be provided such that the shape thereof is deformed to another shape according to the shape of the target substrate, which may be a deposition surface, the shape of the mask frame FR supporting the mask sheet MS, or the like within the spirit and the scope of the disclosure. It is to be understood that the shapes disclosed herein may include shapes substantially identical or similar to the shapes.

When viewed in a plan view, the opening regions MC in the mask sheet MS according to an embodiment may have a rectangular shape, but an embodiment not limited thereto. The shape of the opening regions MC may be deformed to have various shapes according to the shapes of functional layers deposited and formed on the target substrate.

The mask sheet MS may include an upper surface MS-US and a lower surface MS-DS facing each other, and an opening OP passing between the upper surface MS-US and the lower surface MS-DS may be defined in the mask sheet MS. The opening region MC may be defined in the mask sheet MS by the opening OP passing between the upper surface MS-US and the lower surface MS-DS.

In the mask MK according to an embodiment, the mask sheet MS may include the opening region MC and a masking region MSA. The opening region MC may be defined as a region between the masking regions MSA. The opening region MC may be a region corresponding to a planar region of a functional layer in the form of a common layer included in one display device DD (see FIG. 1). The opening region MC may correspond to a deposition area of the target substrate in which a deposition material is provided. The deposition material may be provided on the target substrate according to the shape of the opening region MC.

In the disclosure, the width of the opening region MC may be defined as the width of an opening region, in the opening OP, adjacent to the target substrate on which a deposition material is provided. For example, in an embodiment illustrated in FIGS. 3, 4, for example, the opening region MC may be an opening region adjacent to the lower surface MS-DS of the mask sheet MS.

In the mask MK according to an embodiment, the mask sheet MS may include a protrusion MS-EP protruding from the lower surface MS-DS, and a recess MS-GP recessed from the lower surface MS-DS. For example, the mask sheet MS according to an embodiment may include a base portion MS-BS in which a spacing or distance between the upper surface MS-US and the lower surface MS-DS facing each other is constant, the protrusion MS-EP protruding from and disposed on the lower surface MS-DS of the base portion MS-BS, and the recess MS-GP concavely recessed from the lower surface MS-DS toward the upper surface MS-US. The opening regions MC of the mask sheet MS may be defined in the base portion MS-BS.

The protrusion MS-EP may be a part disposed on the lower surface MS-DS of the mask sheet MS, and formed to protrude in the direction of the fourth directional axis DR4 which may be a direction spaced apart from the lower surface MS-DS. The recess MS-GP may be a part recessed from the lower surface MS-DS of the mask sheet MS, and defined to be recessed in the direction of the third directional axis DR3 which may be a direction of the upper surface MS-US.

The protrusion MS-EP may be disposed adjacent to the opening OP. The protrusion MS-EP may be adjacent to the opening region MC defined by the opening OP. The protrusion MS-EP may be each disposed on both sides of one opening region MC, but an embodiment is not limited thereto. The number of the protrusions MS-EP provided between opening regions MC adjacent to each other may be one, or multiple, for example, at least three.

In a deposition process using the mask MK according to an embodiment, the protrusion MS-EP may be disposed adjacent to the target substrate which may be deposition surface, and the base portion MS-BS may be disposed spaced apart from the target substrate. The protrusion MS-EP may be disposed in contact with the target substrate, and the base portion MS-BS may be disposed spaced apart from the target substrate by a thickness of the protrusion MS-EP.

In an embodiment, the thickness $t_{EP}$ of the protrusion MS-EP may be in a range of about 1 μm to about 10 μm. In case that the thickness $t_{EP}$ of the protrusion MS-EP is less than about 1 μm, a spacing to the target substrate may not be ensured, so that the target substrate by the mask sheet MS may be dented during a deposition process. In case that the thickness $t_{EP}$ of the protrusion MS-EP is greater than about 10 μm, a spacing between the target substrate and the opening region MC is increased, so that a shadow area in which a deposited material is not sufficiently provided becomes widened in a portion defined as a deposition area. Accordingly, in case that the thickness $t_{EP}$ of the protrusion MS-EP is in a range of about 1 μm to about 10 μm, there is no damage to the surface of the target substrate and the effect of forming a thin film with excellent deposition quality may be exhibited.

In an embodiment, the thickness $t_{MS}$ of the base portion MS-BS of the mask sheet MS may be in a range of about 20 μm to about 200 μm. The thickness $t_{MS}$ of the base portion MS-BS may correspond to a spacing or distance between the upper surface MS-US and the lower surface MS-DS of the mask sheet MS. For example, the mask sheet MS according to an embodiment may include the protrusion MS-EP relatively thin compared to the base portion MS-BS, thereby improving the quality of the edge of a deposition surface while protecting the surface of the target substrate. The edge of the deposition surface may be a portion corresponding to a border between a deposition area and a non-deposition area. It can be said that in case that the area of the shadow area in the edge of the deposition surface becomes smaller, the quality of the edge of the deposition surface is improved.

In the mask sheet MS according to an embodiment, a protrusive bottom surface EP-BS may have a curved protrusive surface in a direction spaced apart from the lower surface MS-DS of the mask sheet MS. FIG. 5A illustrates that the protrusion MS-EP has a protrusive bottom surface EP-BS having a protrusion shape, but an embodiment is not limited thereto. While the maximum thickness $t_{EP}$ of the protrusion MS-EP is maintained about 10 μm or less, various shapes of the protrusion MS-EP may be provided.

The mask sheet MS according to an embodiment may include the recess MS-GP defined in the lower surface MS-DS. Recesses MS-GP may be disposed in the lower surface MS-DS of the mask sheet MS according to an embodiment. The recess MS-GP may be disposed adjacent to the protrusion MS-EP. The protrusion MS-EP may be disposed adjacent to the opening OP of the mask sheet MS, and the recess MS-GP may be disposed adjacent to the protrusion MS-EP, and spaced apart from the opening OP.

The recess MS-GP may be formed by being connected to the protrusion MS-EP. One side or a side of the recess MS-GP may be connected or extended to one side or a side of the protrusion MS-EP adjacent thereto. According to a method for manufacturing a mask according to an embodiment described later, the recess MS-GP may be formed through the same process during formation of the protrusion MS-EP. The recess MS-GP and the protrusion MS-EP may be vertically symmetrical to each other with respect to the lower surface MS-DS of the mask sheet MS, but an embodiment is not limited thereto. The shape of the recess MS-GP may be amorphous, or the shapes of recesses MS-GP may be each random.

The thickness $t_{GP}$ of the recess MS-GP may be in a range of about 1 μm to about 10 μm. The thickness $t_{GP}$ of the recess MS-GP may be similar to the thickness $t_{EP}$ of the protrusion MS-EP adjacent thereto, but an embodiment is not limited thereto.

In the mask sheet MS according to an embodiment, the volume of the protrusion MS-EP protruding from the lower surface MS-DS of the mask sheet MS may be similar to the volume of the recess MS-GP adjacent thereto. For example, the protrusion MS-EP and the recess MS-GP, which are simultaneously formed through a process of repeatedly irradiating with a second laser light according to a method for manufacturing a mask according to an embodiment to be described later, may have similar volumes. For example, the volume of the protrusion MS-EP formed to protrude from the lower surface MS-DS of the mask sheet MS and the volume of the recess MS-GP formed to be recessed from the lower surface MS-DS of the mask sheet MS may be similar to each other, but an embodiment is not limited thereto. The volume of the protrusion MS-EP may be greater than the volume of the adjacent recess MS-GP.

Figure 5B:
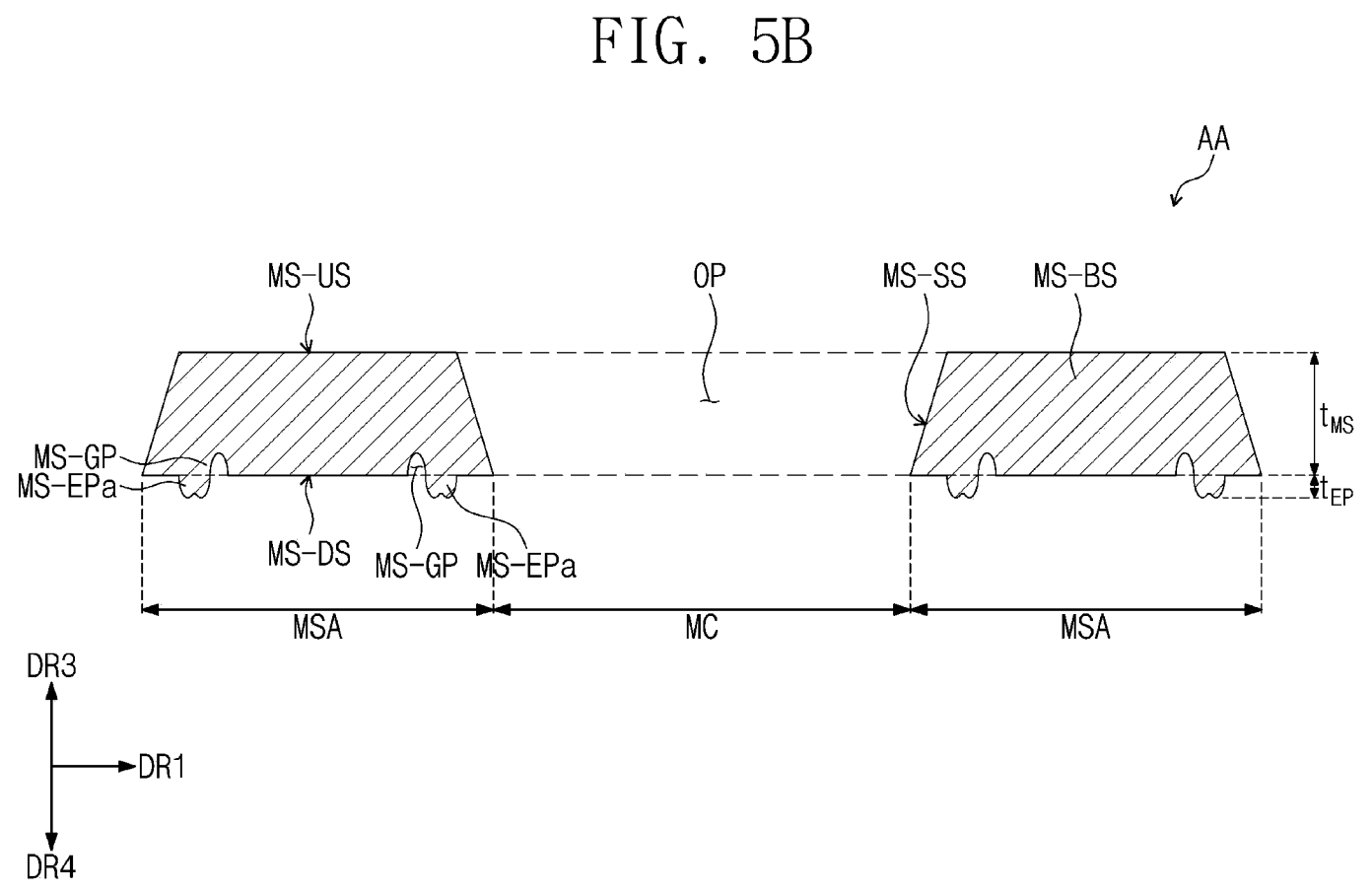

Referring to FIGS. 5A and 5B, the opening OP defined in the mask sheet MS may have a trapezoidal shape on a cross-section. For example, on a cross-section defined by the first directional axis DR1 and the third directional axis DR3, the opening OP may have a trapezoidal shape in which the width thereof decreases from the upper surface MS-US toward the lower surface MS-DS of the mask sheet MS.

The opening OP of the mask sheet MS may be formed using first laser light according to a method for manufacturing a mask according to an embodiment to be described later. Since the opening OP may be formed using laser light, machining precision of an opening side surface MS-SS of the mask sheet MS defining the opening OP may be increased. For example, the shape and size of the opening OP manufactured using laser light are highly conform to the shape and size of the opening OP designed before machining, thereby exhibiting high numerical precision. For example, in an embodiment, a mask in which the opening portions OP are formed may be provided to have a shape and size suitable for those required using laser light.

The mask sheet MS according to an embodiment may also exhibit excellent precision of an arrangement shape of openings OP, and excellent numerical precision of the masking region MSA defined between the openings OP.

The opening side surface MS-SS of the mask sheet MS defining the opening OP may have inclination with respect to the lower surface MS-DS of the mask sheet MS. The angle of inclination $\theta_{MS}$ of the opening side surface MS-SS of the mask sheet MS with respect to the lower surface MS-DS of the mask sheet MS may be in a range of about 30° to about 70°. For example, the angle of inclination $\theta_{MS}$ may be in a range of about 40° to about 60°. In an embodiment, in case that the angle of inclination $\theta_{MS}$ of the opening side surface MS-SS may be in a range of about 30° to about 70°, a ratio of an area of a deposition area to an area of a mask sheet may be increased, and the formation of a shadow area in the deposition area may be minimized.

As the opening OP is formed through laser, a machining mark caused by laser beams may be left on the opening side surface MS-SS of the mask sheet MS defining the opening OP. For example, the machining mark may be shown as moire, for example, on the opening side surface MS-SS, but the form of the machining mark caused by laser is not limited thereto. The machining mark caused by laser beam is discriminatively observed, compared to the case of machining an opening portion with wet-etching.

An oxide layer may be formed on the opening side surface MS-SS of the mask sheet MS exposed in the opening OP. For example, an oxide layer of a metal material constituting the mask sheet MS may be formed on the opening side surface MS-SS. For example, the mask sheet MS according to an embodiment may additionally include, on an exposed portion thereof, an oxide layer compared to the case of machining an opening portion with wet-etching.

FIG. 5B is a schematic cross-sectional view illustrating a part of a mask sheet according to an embodiment. FIG. 5B may illustrate a part corresponding to region AA in FIG. 4. FIG. 5B illustrates an embodiment in which the shape of a protrusion MS-EPa in a mask sheet is different from that of a protrusion MS-EP in FIG. 5A.

The protrusion MS-EPa according to an embodiment may include peak parts convex in a direction spaced apart from the lower surface MS-DS. FIG. 5B discloses the protrusion MS-EPa including two peak parts, but an embodiment is not limited thereto, and three or more peak parts may be included. In case that peak parts are included, the thicknesses of the peak parts may be the same as or different from each other, and the shapes thereof may be similar to or different from each other.

In an embodiment, the recess MS-GP may be disposed adjacent to the protrusion MS-EPa including peak parts. In an embodiment, the shape of the recess MS-GP may not be symmetrical to the shape of the protrusion MS-EPa with respect to the lower surface MS-DS of a mask sheet. For example, in an embodiment, the protrusion MS-EPa may include peak parts, but the recess MS-GP adjacent thereto may include only one recess.

In a mask sheet according to an embodiment, the shapes of the protrusion MS-EP and the recess MS-GP are not limited to those illustrated in FIGS. 5A and 5B, and the protrusion MS-EP and the recess MS-GP may have various shapes within the range in which the thickness of the protrusion MS-EP may be in a range of about 1 μm to about 10 μm.

Figure 6A:
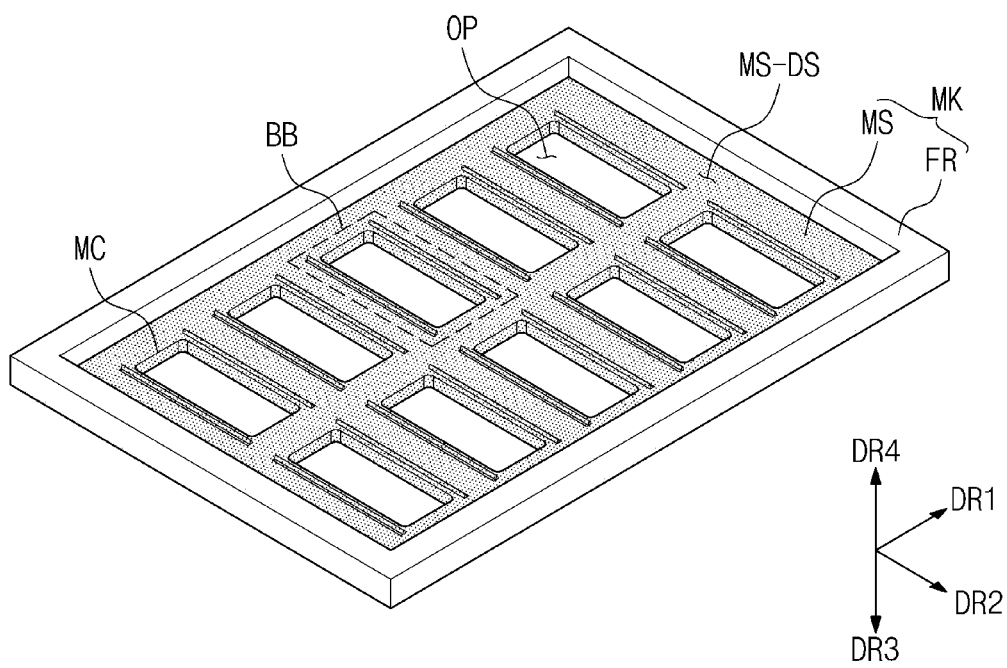
FIG. 6A is a schematic perspective view of a mask according to an embodiment.
Figure 6B:
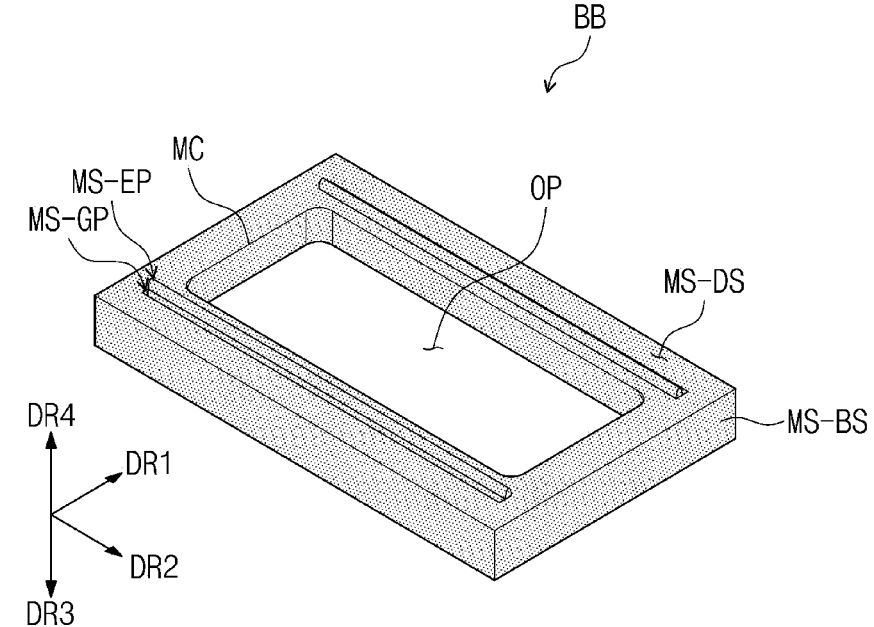
FIG. 6B is a schematic perspective view of a part of a mask according to an embodiment.

FIG. 6A is a schematic perspective view of a mask according to an embodiment, and FIG. 6B is a schematic perspective view illustrating a part of a mask according to an embodiment. FIG. 6B illustrates a part corresponding to region BB in FIG. 6A. FIGS. 6A and 6B illustrate that a lower surface MS-DS of a mask sheet MS faces upwards.

Referring to FIGS. 6A and 6B, in a mask MK according to an embodiment, opening regions MC may be defined in a mask sheet MS. The opening regions MC may be arranged spaced apart from each other in a plan view defined by the first directional axis DR1 and the second directional axis DR2.

The opening regions MC may each have a rectangular shape in a plan view. In an embodiment, the protrusions MS-EP and the recesses MS-GP adjacent to the opening regions MC may each have a stripe shape parallel to one side surface or a side surface of each of the opening regions MC in a plan view.

Referring to FIGS. 6A and 6B, in an embodiment, the protrusions MS-EP may be disposed in the form of a stripe on both sides with an opening region MC therebetween. The protrusion MS-EP may be disposed in the form parallel to one side or a side of the opening region MC having a rectangular shape, and the recess MS-GP may be disposed adjacent to the protrusion MS-EP. In an embodiment, the protrusion MS-EP may convexly protrude in the direction of the fourth directional axis DR4, and the recess MS-GP may be concavely recessed in the direction of the third directional axis DR3.

FIG. 6A illustrates an embodiment in which the protrusion MS-EP and the recess MS-GP are disposed in parallel to the direction of the long side of the opening region MC having a rectangular shape, on both sides thereof with one opening region MC therebetween. For example, FIG. 6A illustrates that two protrusions MS-EP and two recesses MS-GP are disposed between adjacent opening regions MC, but an embodiment is not limited thereto.

For example, one protrusion MS-EP and one recess MS-GP may be disposed between adjacent opening regions MC, three or more protrusions MS-EP and three or more recesses MS-GP may be disposed between adjacent opening regions MC unlike those illustrated, or the protrusion MS-EP and the recess MS-GP may not be disposed between two adjacent opening regions MC and two or more opening regions MC may be disposed between two adjacent protrusions MS-EP. Different from those illustrated in FIGS. 6A and 6B, the protrusion MS-EP and the recess MS-GP may have shapes extending in a direction parallel to the short side of the opening region MC having a rectangular shape.

Figures 7A, 7B:
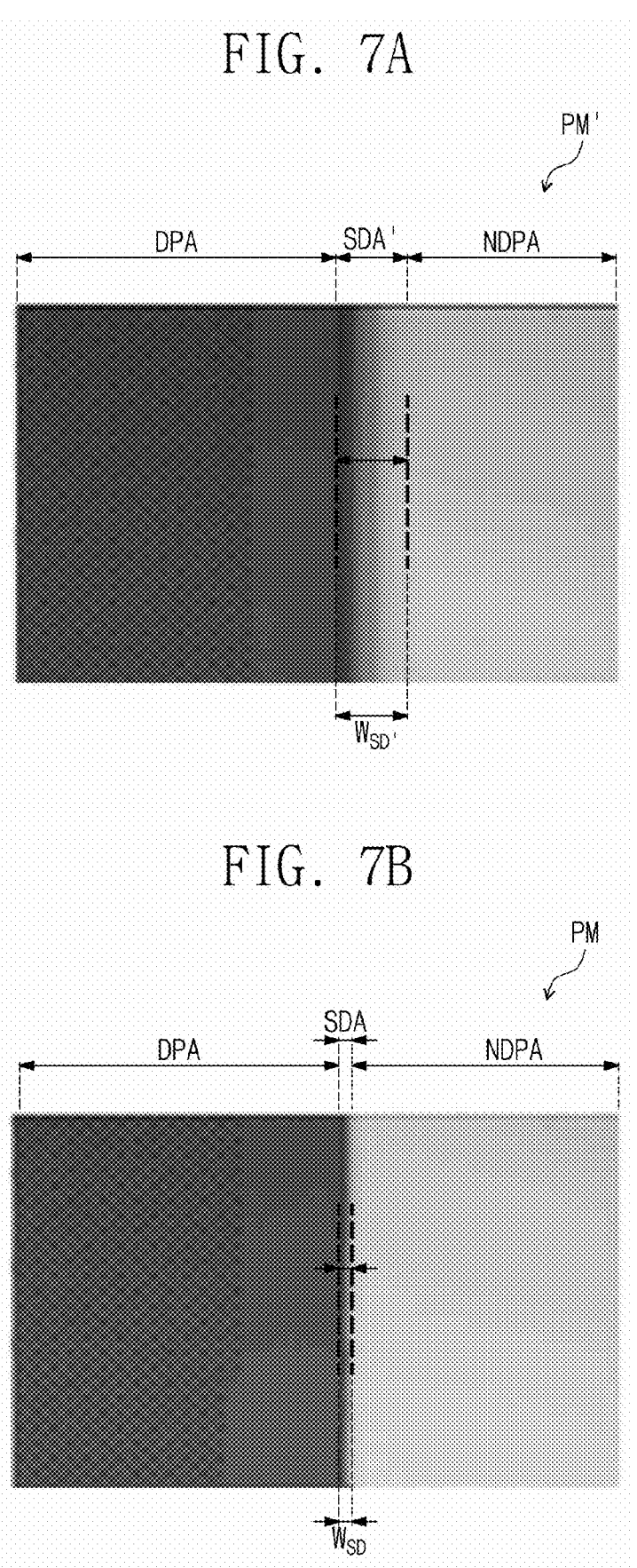
FIG. 7A is an image showing a deposition surface of Comparative Example using a related art mask.
FIG. 7B is an image showing a deposition surface of Example using a mask according to an embodiment.

FIGS. 7A and 7B are images showing deposition portions formed by using a mask, respectively. FIG. 7A is an image of a portion deposited by using a mask according to Comparative Example, and FIG. 7B is an image of a portion deposited by using a mask of the foregoing embodiment according to Embodiment.

FIGS. 7A and 7B show images of the upper surfaces of target substrates PM and PM' after depositing a deposition material by using a mask, respectively. Comparing FIGS. 7A and 7B, the shadow areas SDA and SDA' have different surface areas.

FIG. 7A shows a deposition area DPA, a non-deposition area NDPA, and a shadow area SDA' existing therebetween according to Comparative Example. FIG. 7B shows a deposition area DPA, a non-deposition area NDPA, and a shadow area SDA therebetween using the mask of the foregoing embodiment according to Embodiment.

Referring to the images of FIGS. 7A and 7B, it may be confirmed that a width $W_{SD}$ of a shadow area SDA formed after performing a deposition process by using a mask MK according to an embodiment is less than a width $W_{SD}'$ of a shadow area SDA' formed after performing a deposition process by using a mask according to Comparative Example. For example, in the target substrates PM and PM' having a same surface area, the area of the deposition area DPA according to Embodiment in FIG. 7B may be greater than that of the deposition area DPA according to Comparative Example in FIG. 7A.

For example, the mask according to an embodiment may include a protrusion disposed on a lower surface of a mask sheet to minimize a distance spaced apart from the target substrate, thereby widening the surface area of the deposition area and thus reducing the shadow area between the deposition area and the non-deposition area while maintaining an interval spaced apart from the target substrate to prevent the target substrate from being stabbed. Accordingly, the mask according to an embodiment may include a protrusion having a thickness of about 10 μm or less on the lower surface of the mask sheet thereof and thus may be used in manufacturing a thin film layer having high precision and excellent deposition quality.

Hereinafter, a method for manufacturing a mask according to an embodiment will be described with reference to FIGS. 8 to 10B, for example. In the description of the method for manufacturing the mask according to an embodiment, the same contents as those described with reference to FIGS. 1 to 7B, for example, will not be described again, and differences will be described.

Figure 8:
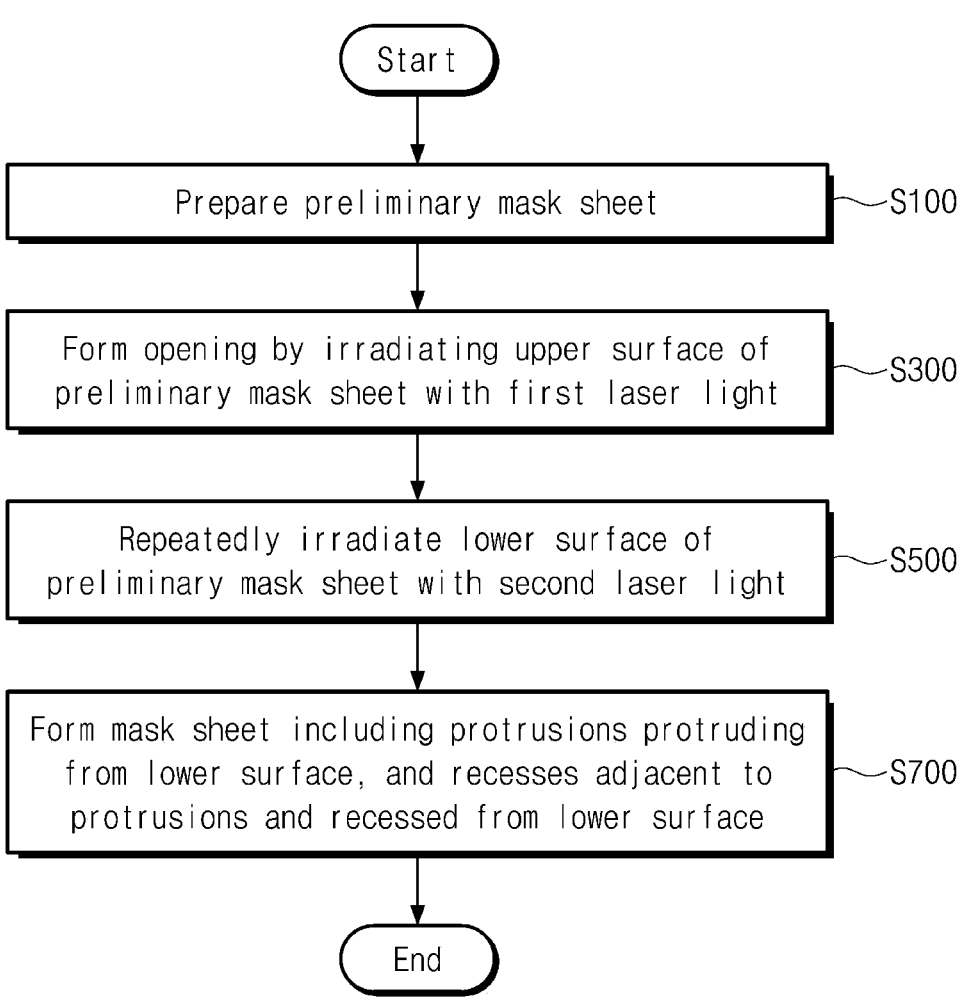
FIG. 8 is a flowchart illustrating a method for manufacturing a mask according to an embodiment.

FIG. 8 is a flowchart illustrating a method for manufacturing a mask according to an embodiment. FIGS. 9A to 9D are schematic diagrams illustrating examples of processes of the method for manufacturing the mask according to an embodiment, respectively.

Figure 9A:
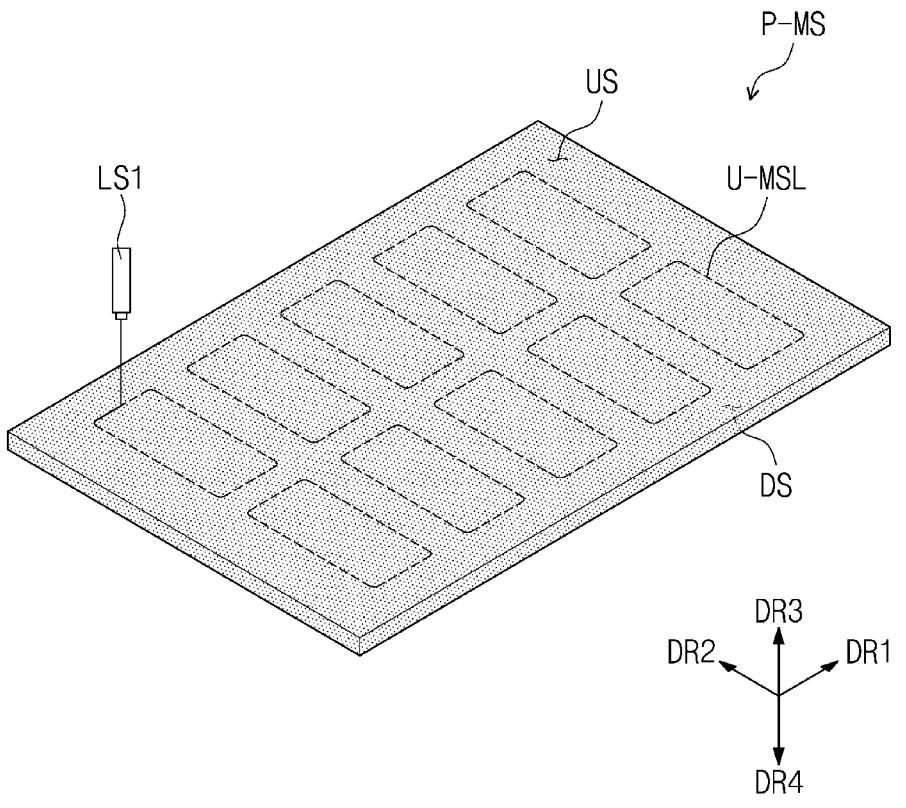
FIGS. 9A to 9D are schematic diagrams illustrating operations of a method for manufacturing a mask according to an embodiment, respectively.
Figure 9B:
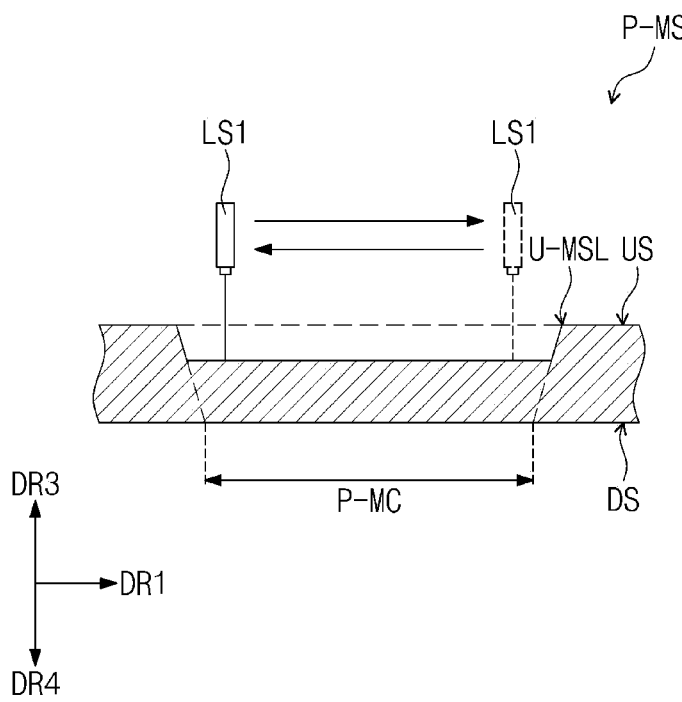
Figure 9C:
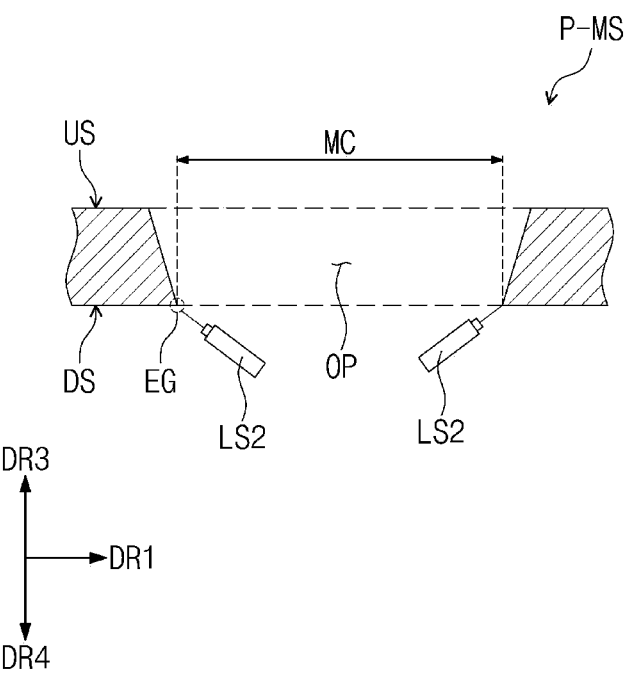
Figure 9D:
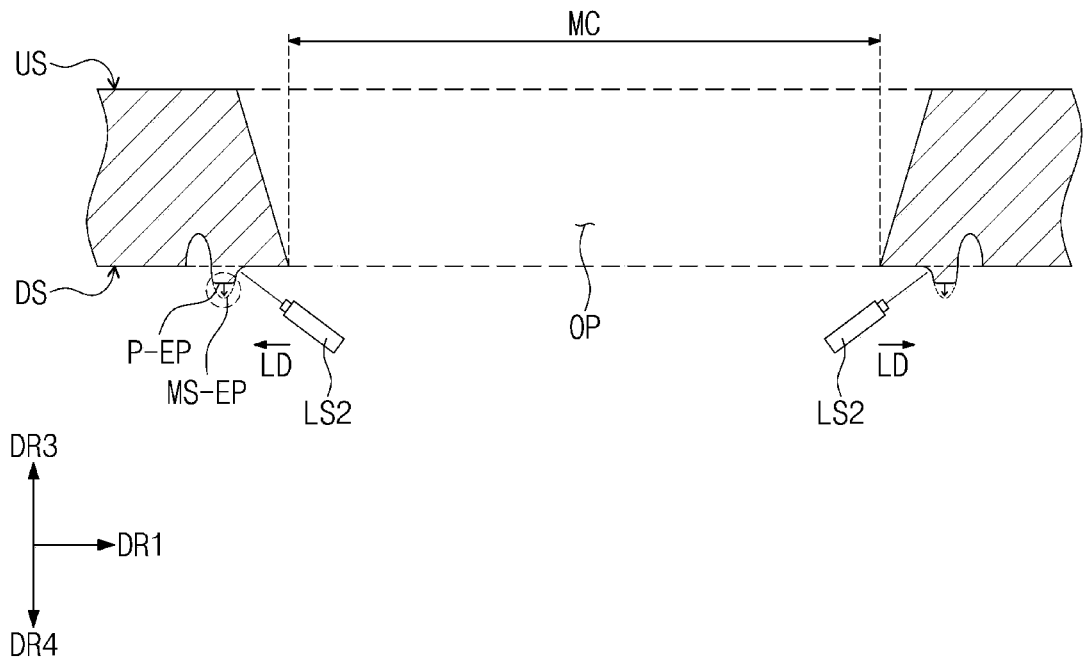

Referring to FIGS. 8 to 9D, for example, the method for manufacturing a mask according to an embodiment may include a process (S100) of preparing a preliminary mask sheet, a process (S300) of forming an opening by irradiating an upper surface of the preliminary mask sheet with first laser light, a process (S500) of repeatedly irradiating the lower surface of the preliminary mask sheet with second laser light, and a process (S700) of forming a mask sheet including a protrusion protruding from the lower surface and a recess adjacent to the protrusion and recessed from the lower surface.

In the method for manufacturing a mask according to an embodiment, the process (S100) of preparing of the preliminary mask sheet may include a process of providing the preliminary mask sheet P-MS including the upper surface US and the lower surface DS facing each other. The preliminary mask sheet P-MS may correspond to a member to be processed before forming the opening OP. The preliminary mask sheet P-MS may include an alloy of iron and nickel. The preliminary mask sheet P-MS may include invar.

FIGS. 9A and 9B are schematic diagrams illustrating a portion of the process (S300) of forming the opening by irradiating the upper surface of the preliminary mask sheet with the first laser light. Referring to FIGS. 8 to 9B, for example, a processing line U-MSL corresponding to a portion in which the opening OP (see FIG. 9C) is to be defined later may be defined in the preliminary mask sheet P-MS. A portion illustrated as the processing line U-MSL in FIG. 9A is a virtual line, and is illustrated as a portion corresponding to an outer line of an area irradiated with the first laser light LS1 to form the opening OP later.

The first laser light LS1 may be incident onto the upper surface US of the preliminary mask sheet P-MS. The first laser light LS1 may be incident along the processing line U-MSL designed in consideration of a shape of an opening area MC. The first laser light LS1 may be sequentially provided onto the entire area inside the portion marked with the processing line U-MSL.

The first laser light LS1 may be provided onto the entire area inside the processing line U-MSL on the upper surface US of the uppermost portion of the preliminary mask sheet P-MS, and may be sequentially provided in the fourth directional axis DR4, which is the direction of a lower surface DS. The first laser light LS1 may be provided while moving in the left and right direction to process the inner area of the processing line U-MSL. The first laser light LS1 may be provided even on a preliminary open area P-MC of the lower surface DS of the preliminary mask sheet P-MS to correspond to the opening area MC (see FIG. 9C).

A width of the opening OP (see FIG. 9C) formed by being irradiated with the first laser light LS1 may gradually decrease from the upper surface US to the lower surface DS. The opening OP (see FIG. 9C) may be formed by irradiating the preliminary mask sheet P-MS with the first laser light LS1 so that an angle of inclination $\theta_{MS}$ of an opening side surface MS-SS (see FIG. 5A) exposed by the opening OP (see FIG. 9C) with respect to the lower surface is in a range of about 30° to about 70°.

FIGS. 9C and 9D are schematic diagrams illustrating a portion of the process (S500) of repeatedly irradiating the lower surface of a preliminary mask sheet with the second laser light. Referring to FIGS. 9C and 9D, in the process (S500) of the repeated irradiation of the second laser light, the second laser light LS2 may be provided on the lower surface DS of the preliminary mask sheet P-MS adjacent to the opening OP. The second laser light LS2 may be provided on an edge ED of the lower surface DS of the preliminary mask sheet P-MS. The second laser light LS2 may be repeatedly provided on the lower surface DS of the preliminary mask sheet P-MS. The portion irradiated with the second laser light LS2 may be repeatedly irradiated with the second laser light LS2 again. As a result, a preliminary protrusion P-EP is formed in a direction spaced apart from the lower surface DS of the preliminary mask sheet P-MS due to a laser overwriting phenomenon according to the repeated irradiation of laser light. The preliminary protrusion P-EP is continuously and repeatedly irradiated with the second laser light LS2 and finally is grown as a protrusion MS-EP.

Referring to FIGS. 9C and 9D, the lower surfaces DS of the preliminary mask sheets P-MS of both sides defining the opening OP may be each irradiated with the second laser light LS2. Accordingly, the protrusions MS-EP may be each formed on both sides of the opening area MC with the opening area MC therebetween.

A recess MS-GP may be formed in the process (S500) of repeatedly irradiating the lower surface of the preliminary mask sheet with the second laser light. The recess MS-GP may be formed adjacent to the protrusion MS-EP. One side or a side of the recess MS-GP may be connected to the protrusion MS-EP. For example, the protrusion MS-EP and the recess MS-GP may be formed through one process of the process (S500) of the repeated irradiation S500 of the second laser light. In case that the protrusion MS-EP is formed, the recess MS-GP may be formed to gradually become larger.

The protrusion MS-EP may be formed adjacent to the opening OP to correspond to an irradiation direction LD of the second laser light LS2, and the recess MS-GP may be formed adjacent to the protrusion MS-EP. In case that the irradiation direction LD of the second laser light LS2 is referred to as a processing direction, the protrusion MS-EP and the recess MS-GP connected to the protrusion MS-EP may be provided along the processing direction.

The first laser light and the second laser light used in the method for manufacturing the mask according to an embodiment described with reference to FIGS. 8 to 9D may each have a pulse width in a range of about femtoseconds ($10^{-15}$) to about picoseconds ($10^{-12}$). For example, in the method for manufacturing the mask according to an embodiment, the opening area of the mask sheet and the protrusion included in the mask sheet may be readily processed by using the laser light having a small pulse width. In the method for manufacturing the mask according to an embodiment, the open area having high processing precision may be formed, and the protrusion having a thickness of about 10 μm or less may be processed by using the laser light having the pulse width in a range of about femtoseconds ($10^{-15}$) to about picoseconds ($10^{-12}$).

In an embodiment, the first laser light LS1 and the second laser light LS2 may be the same types of laser light. For example, the pulse widths of the first laser light LS1 and the second laser light LS2 may be the same. However, an embodiment is not limited thereto.

The first laser light LS1 and the second laser light LS2 may have the same power or have power different from each other. For example, the power of the first laser light LS1 for forming the opening OP may be greater than that of the second laser light LS2 repeatedly irradiated. However, an embodiment is not limited thereto.

Figure 10A:
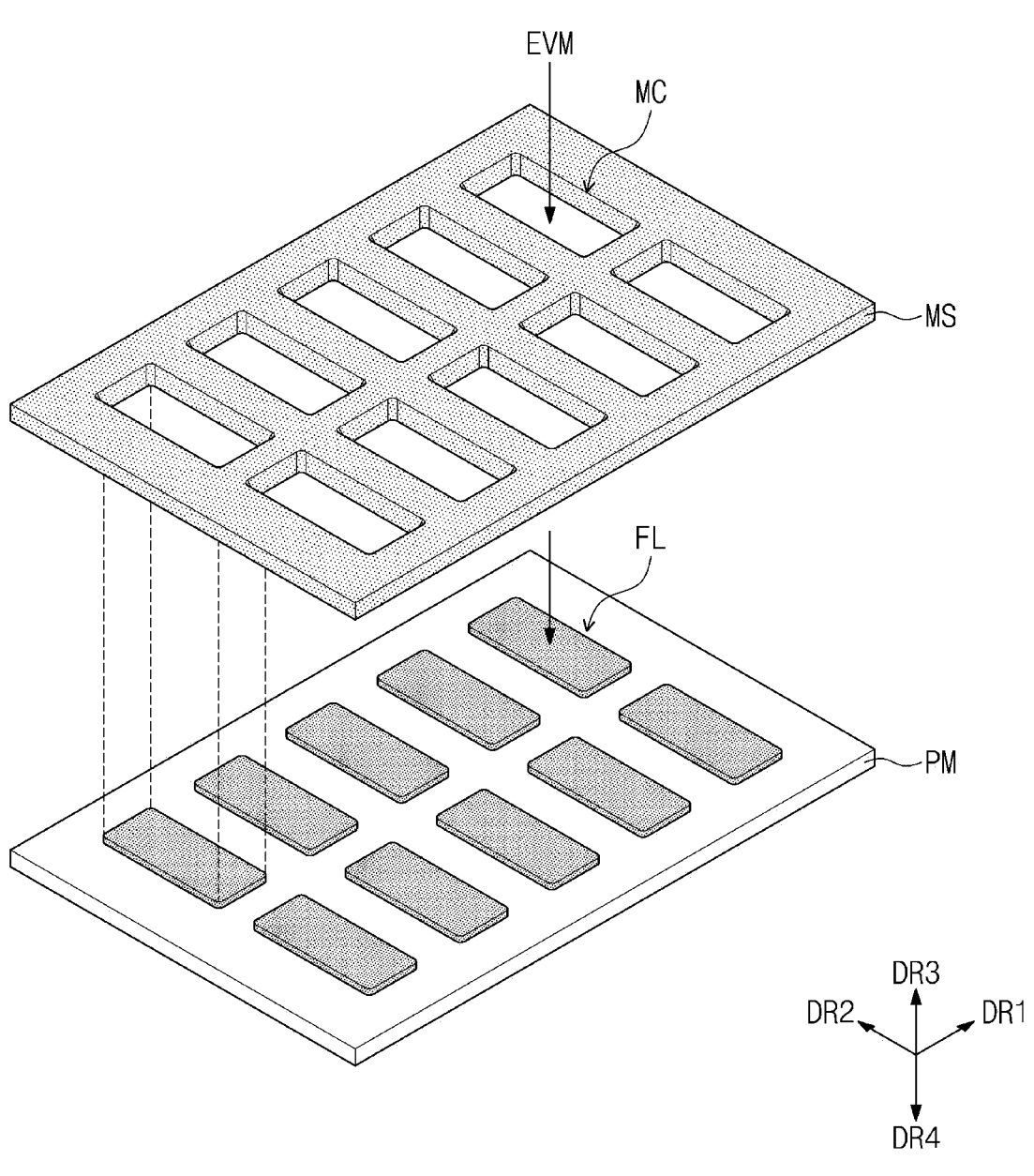
FIG. 10A is a schematic diagram illustrating a deposition process using a mask according to an embodiment.
Figure 10B:
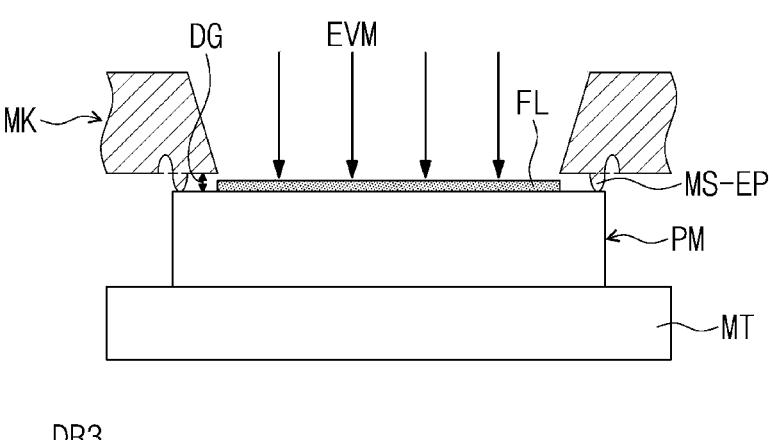
FIG. 10B is a schematic diagram illustrating a deposition process using a mask according to an embodiment.

FIGS. 10A and 10B are schematic diagrams illustrating an example of a deposition process using the mask according to an embodiment, respectively. FIG. 10A is a perspective view illustrating an example of the deposition process using the mask according to an embodiment, and FIG. 10B is a schematic cross-sectional view illustrating a portion of the deposition process using the mask according to an embodiment.

Referring to FIGS. 10A and 10B, the mask according to an embodiment may be used for depositing functional layers FL on a target substrate PM. The target substrate PM may be a base material on which the functional layers FL are disposed. The target substrate PM may be disposed to be fixed to a processing table MT.

An area of each of the functional layers FL formed on the target substrate PM may be a functional layer of the common layer included in the display device DD (see FIG. 1) described in FIG. 1, for example. The functional layers FL may be formed corresponding to an opening area MC of a mask sheet MS. The functional layers FL may be formed by providing a deposition material EVM including a same material or a similar material through the mask sheet MS.

A mask MK according to an embodiment may include a protrusion MS-EP on a surface adjacent to a target substrate PM to maintain a spaced distance DG while minimizing a contact area between the target substrate PM and the mask MK. Therefore, while minimizing a shadow area, the functional layers FL may be deposited, and damage and pollution of the surface of the target substrate PM may be minimized.

The mask according to an embodiment may include an opening area processed by laser light, and a protrusion adjacent to the opening area, disposed on the lower surface of the mask sheet, and processed by the laser light to improving precision of the deposition area in manufacturing the display device and minimizing the damage of the target substrate.

The method for manufacturing the mask according to an embodiment may include the process of forming the opening by providing the upper surface of the preliminary mask sheet with the laser light, and the process of forming the mask sheet including the protrusion adjacent to the opening by repeatedly irradiating the lower surface of the preliminary mask sheet with the laser light to provide the mask which has the high dimensional precision of the open area, and is capable of minimizing the surface area of the shadow area on the deposition surface.

In the embodiment, the protrusion processed by the laser light and formed adjacent to the open area and the target substrate may be provided to provide the mask having the improved deposition precision the deposited functional layers.

In the method for manufacturing the mask according to the embodiment, the laser light may be irradiated onto both the upper surface and the lower surface and thus may be used for manufacturing the mask having the excellent dimensional precision on the open area and the minimized shadow area on the deposition area.

In the above, description has been made with reference to embodiments, but those skilled in the art or those of ordinary skill in the relevant technical field may understand that various modifications and changes may be made to the disclosure within the scope not departing from the spirit and the technology scope of the disclosure described in the claims.

Therefore, the technical scope of the disclosure is not limited to the contents described in the detailed description of the specification, but should also be determined by the claims.

What is claimed is:

1. A method for manufacturing a mask, the method comprising:

preparing a preliminary mask sheet including an upper surface and a lower surface opposite each other;

forming an opening by irradiating the upper surface of the preliminary mask sheet with first laser light such that the opening penetrates from the upper surface to the lower surface of the preliminary mask sheet;

irradiating repeatedly, with second laser light, the lower surface of the preliminary mask sheet adjacent to the opening; and forming a mask sheet including a protrusion adjacent to the opening and protruding from the lower surface, and a recess adjacent to the protrusion and recessed from the lower surface, by repeating irradiation with the second laser light.

2. The method of claim 1, wherein the first laser light and the second laser light each have a pulse width in a range of about $10^{-15}$ sec to about $10^{-12}$ sec.

3. The method of claim 1, wherein in the forming of the opening, a width of the opening decreases from the upper surface toward the lower surface of the preliminary mask sheet.

4. The method of claim 1, wherein an opening side surface of the mask sheet, exposed in the opening has an inclination angle in a range of about 30° to about 70° with respect to the lower surface of the preliminary mask sheet.

5. The method of claim 1, wherein the irradiating repeatedly, with the second laser light, of the lower surface of the preliminary mask sheet includes repeatedly irradiating a same point in the lower surface adjacent to the opening with the second laser light of a same power.

6. The method of claim 1, wherein the protrusion has a height in a range of about 1 μm to about 10 μm.

7. The method of claim 1, wherein the forming of the mask sheet includes:

forming the protrusion adjacent to the opening according to an incident angle of the second laser light, and forming the recess adjacent to the protrusion.

* * * * *